United States Patent
Boelstler et al.

(10) Patent No.: US 8,963,411 B2
(45) Date of Patent: Feb. 24, 2015

(54) ASSEMBLY FOR ILLUMINATING A CONTROL PANEL

(75) Inventors: Richard A. Boelstler, Lake Orion, MI (US); Eluid David Carter, Southfield, MI (US)

(73) Assignee: Methode Electronics, Inc., Chicago, IL (US)

( * ) Notice: Subject to any disclaimer, the term of this patent is extended or adjusted under 35 U.S.C. 154(b) by 714 days.

(21) Appl. No.: 12/612,185

(22) Filed: Nov. 4, 2009

(65) Prior Publication Data

US 2010/0142211 A1 Jun. 10, 2010

Related U.S. Application Data

(60) Provisional application No. 61/111,215, filed on Nov. 4, 2008.

(51) Int. Cl.
*B60Q 3/04* (2006.01)
*H03K 17/96* (2006.01)

(52) U.S. Cl.
CPC .............. *B60Q 3/044* (2013.01); *H03K 17/962* (2013.01); *H03K 2217/960785* (2013.01)
USPC .......................................... 313/473; 313/116

(58) Field of Classification Search
USPC ..................... 313/473, 116; 362/355, 311.04; 359/599, 615; 345/173, 174; 250/458.1
See application file for complete search history.

(56) References Cited

U.S. PATENT DOCUMENTS

| | | | | |
|---|---|---|---|---|
| 5,771,039 A * | 6/1998 | Ditzik | ........................... | 345/178 |
| 6,072,445 A * | 6/2000 | Spitzer et al. | ..................... | 345/8 |
| 6,424,403 B1 * | 7/2002 | Leenhouts et al. | ............ | 349/199 |
| 6,476,783 B2 * | 11/2002 | Matthies et al. | ................. | 345/82 |
| 2002/0192445 A1 * | 12/2002 | Ezzell et al. | .................. | 428/212 |
| 2005/0007000 A1 * | 1/2005 | Chou et al. | .................... | 313/116 |
| 2005/0207137 A1 * | 9/2005 | Nishikawa et al. | ............. | 362/84 |
| 2006/0290253 A1 * | 12/2006 | Yeo et al. | ....................... | 313/116 |

* cited by examiner

*Primary Examiner* — Anne Hines
*Assistant Examiner* — Christopher Raabe
(74) *Attorney, Agent, or Firm* — Blank Rome, LLP

(57) ABSTRACT

A control console assembly includes a diffusion layer and an electrode of a capacitive sensor. The diffusion layer has an outer surface and an inner surface substantially opposite the outer surface. The electrode of the capacitive sensor is mated to at least one of the inner surface or the outer surface of the diffusion layer.

22 Claims, 6 Drawing Sheets

ASSEMBLY FOR ILLUMINATING A CONTROL PANEL

CROSS-REFERENCE TO RELATED APPLICATIONS

This application claims priority to provisional patent application Ser. No. 61/111,215, entitled "Method for Concealing Electronic Traces and Components Behind Decorative Transparent or Translucent Panels," filed Nov. 4, 2008, which is incorporated herein by reference in its entirety.

FIELD OF THE INVENTION

The present invention relates to illuminating a control panel. In particular, the present invention relates to illuminating through intervening components to illuminate indicia on a control panel.

BACKGROUND OF THE INVENTION

When a control panel with indicia or controls must be illuminated, a single light source to illuminate the control panel is often placed behind the control panel to provide backlighting so that the light source can illuminate the indicia or controls from behind. Thus, the indicia or control is visible to a user in low ambient light.

However, the indicia or control is not fully illuminated or not fully visible when backlit. Intervening components are often required between the panel and the light source. As shown in FIG. 1, these intervening components cause shadowing or produce a shadow of the intervening component that falls upon the illuminated indicia or control. The intervening components also cause negative imaging where light from the light source is blocked and a dark mirror image of the intervening component appears on the backlit indicia or control. Thus, the indicia or control is not fully illuminated or fully visible to the user when backlit.

Thus, a need in the art exists for an assembly for illuminating indicia or controls with substantially no shadowing or negative imaging.

SUMMARY OF THE INVENTION

Accordingly, an aspect of the invention may provide a control console assembly. The control console assembly includes a diffusion layer and an electrode of a capacitive sensor. The diffusion layer has an outer surface and an inner surface substantially opposite the outer surface. The electrode of the capacitive sensor is mated to at least one of the inner surface or the outer surface of the diffusion layer.

Another aspect of the invention may provide a control console assembly. The control console assembly includes a panel, a diffusion layer, and an electrode of a capacitive sensor. The panel has an outer surface and an inner surface substantially opposite the outer surface and a portion of light passes through the panel. The diffusion layer is substantially adjacent the inner surface of the panel and has an outer surface and an inner surface substantially opposite the outer surface. The outer surface of the diffusion layer is substantially adjacent the inner surface of the panel, and the electrode of the capacitive sensor is mated to at least one of the inner surface or the outer surface of the diffusion layer.

Yet another aspect of the invention may provide a control console assembly. The control console assembly includes a diffusion layer, a coating, and an electrode of a capacitive sensor. The diffusion layer has an outer surface and an inner surface substantially opposite the outer surface. The coating is on the outer surface of the diffusion layer, and the electrode of the capacitive sensor is mated to at least one of the inner surface or the outer surface of the diffusion layer.

Other objects, advantages and salient features of the invention will become apparent from the following detailed description, which, taken in conjunction with the annexed drawings, discloses exemplary embodiments of the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
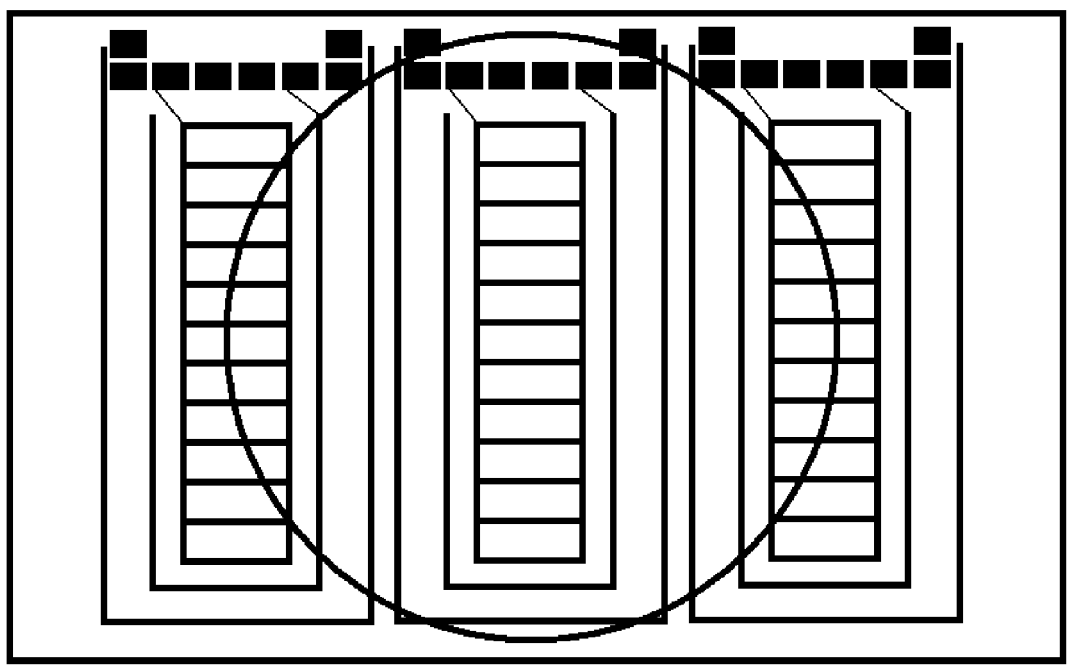
FIG. 1 is a front elevational view of a panel illuminated without an assembly for illuminating a panel in accordance with an embodiment of the invention.

Referring to FIGS. 2-6, the invention provides an assembly 100 for illuminating one or more controls, graphic images, indicia, or combinations of the aforementioned, collectively referenced by number 104 in the figures. The assembly 100 provides generally uniform illumination to the one or more controls, graphic images, and indicia 104 with substantially no shadowing or negative imaging.

The assembly 100 for illuminating one or more controls, graphic images, and indicia 104 can include a diffusion layer 106 with a first surface 108 and a second surface 110 opposite the first surface 108. The diffusion layer 106 has the first surface 108 disposed as an outer surface 108 and the second surface 110 disposed as an inner surface 110 substantially opposite the outer surface 108 separated by the thickness of the diffusion layer 106. The terms "inner" and "outer" are not meant to be limiting to the invention. Instead, these terms are used to describe the relative positions of components in relation to one another. As used herein, the term "inner" refers to a direction towards a light source 116, and the term "outer" refers to a direction away from the light source 116. A coating 112 is disposed on at least the first surface 108 or the second surface 110. The coating 112 can include the one or more controls 104, graphic images 104, indicia 104, or some combination of the aforementioned. For example, in some embodiments, the coating 112 can be disposed on the outer surface 108 and include the or more controls 104, graphic images 104, indicia 104, or some combination thereof.

The assembly 100 can be placed adjacent to one or more components 114 (shown in phantom) that can, at least, partially block light from the light source 116. Because the one or more components 114 are between the light source 116 and the coating 112, the one or more components 114 can at least partially block light from the light source 116 and cause shadowing, negative imaging, or some other impediment to fully illuminating the controls or indicia 104 of the coating 112. The assembly 100 can diffuse the light from the light source 116 to provide substantially uniform illumination. The assembly 100 can also obscure the components 114 so their shadows or negative images do not appear on the control or indicia 104 on the panel 102. Furthermore, for embodiments having a capacitive sensor or touch cell as one of the controls 104, the assembly 100 can allow related circuitry, traces, and components to be placed near a surface 108 or 110 of the diffusion layer 106 with substantially no air gap so that the air gap does not substantially degrade the performance of the capacitive sensor or touch cell.

To simplify the description of the invention, the assembly 100 is described in reference to an embodiment where the assembly 100 is disposed within a control panel assembly for an automobile. The control panel assembly may include backlit controls and indicia 104 associated with one or more components or systems of the automobile. For example, the coating 112 can include a control, an indicia, or a graphic image 104 for the automobile's air conditioning system, such as a knob, a button, a sliding switch, an arrow or a word for controlling the temperature setting of the air conditioning system. The indicia or graphic image 104 can be a down arrow or the word "cooler" disposed on the coating 112 near or on the control 104 for lowering the temperature setting of the air conditioning system. Translucent paint and opaque paint can be used together to form the graphic images or indicia 104. In the figures, three controls, indicia, or graphic images 104 are shown; however in other embodiments, there may be more or less than the three shown. The exact number and arrangement of the controls, indicia, or graphic images 104 depends on the requirements of the control console assembly, such as the number of interfaces required between the user and the components or systems of the automobile.

Although the invention is described with reference to an exemplary embodiment applied to an assembly 100 for use with an automobile, the invention is not limited to automotive applications. In other embodiments, the assembly 100 can be used in household appliances, such as a washer, dryer, refrigerator, stove, cook top, dishwasher, and the like; exercise equipment, such as a treadmill, stationary bicycle, rowing machine, and the like; audio equipment, such as a receiver, tuner, speakers, and the like; home entertainment components, such as televisions, recorders, and the like; and other applications wherein an interface for a user may be desired.

Figure 2:
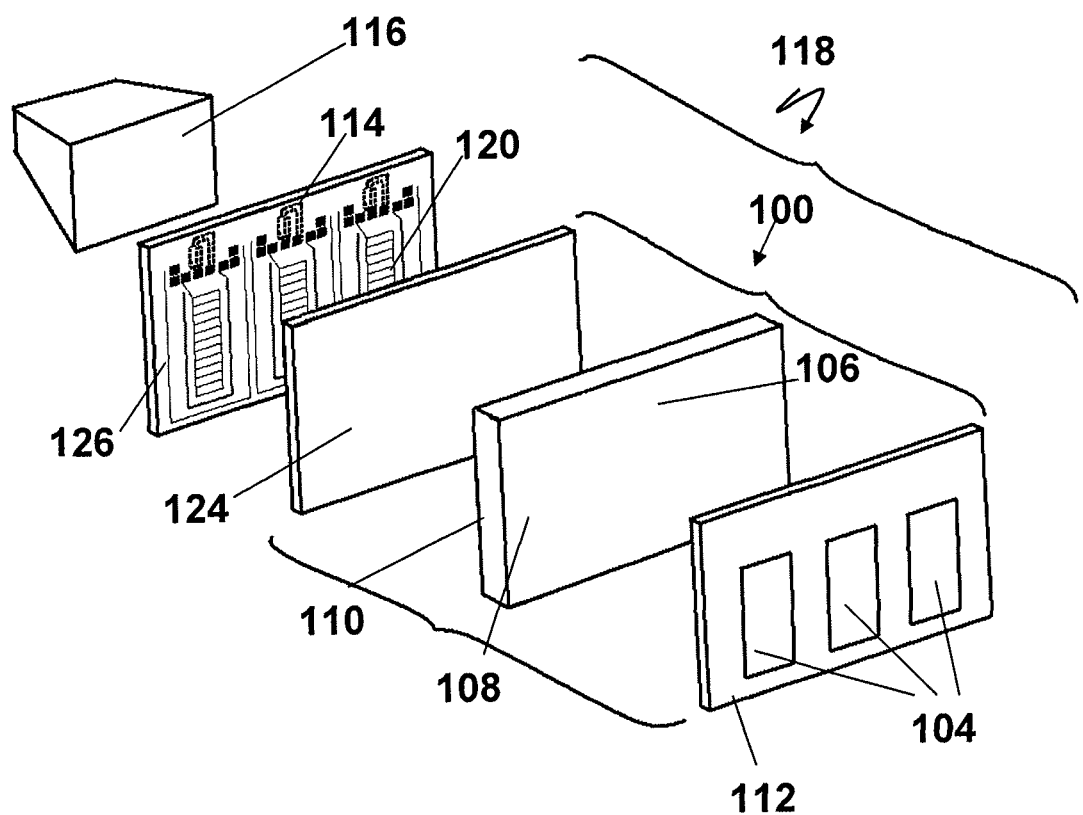
FIG. 2 is an exploded, perspective view of an assembly for illuminating a panel in accordance with an embodiment of the invention.
Figure 3:
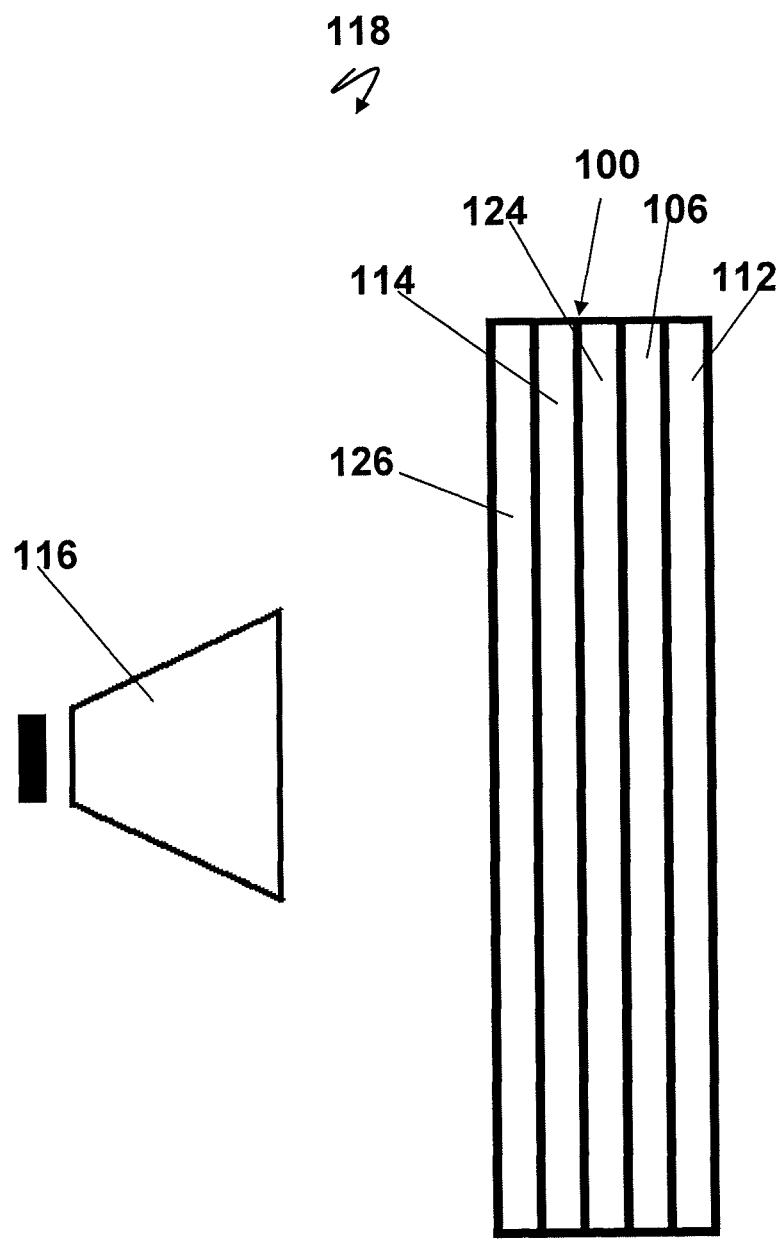
FIG. 3 is a side elevational view of the assembly illustrated in FIG. 2.

Turning to FIGS. 2 and 3, the assembly 100 is shown in an exploded perspective view in an embodiment for an automobile control console assembly 118. The control console assembly 118 provides an interface between a user and one or more mechanical, electrical, or electromechanical systems of the automobile.

Furthermore, in the embodiment shown, one or more of the controls 104 operates in conjunction with a capacitive sensor or a touch cell. The capacitive sensor or the touch cell can have an electrode 120 that is directly disposed under one or more of the controls 104. In other embodiments, one or more of the controls 104 can operate with a device that is mechanical, electrical, optical, some combination of the aforementioned, or some other device that allows a user to interface with another device or system.

The controls, graphic images, or some other indicia 104 can be disposed on the coating 112. The controls 104 can be buttons, knobs, switches, or some other device for controlling an apparatus or system. Alternatively, the graphic images or other indicia 104 can be provided on the diffusion layer 106 by painting the images or indicia 104 with translucent or opaque paints, by etching the images or indicia 104 on a painted portion of the diffusion layer 106, by laser etching, or by other similar methods of disposing an image or indicia 104 on the coating 112 or the inner or outer surfaces 108, 110 of the diffusion layer 106. For example, in some embodiments, the graphic images or some other indicia 104 can be placed on one of the surfaces 108 or 110 of the diffusion layer 106 with a substantially transparent, translucent, or diffusive coating 112, or some other coating 112 that allows some portion of light to pass through it disposed over the surface 108 or 110 of the diffusion layer 106. Other decorative features, such as a bevel (not shown) may be a part of or disposed on the coating 112 or the diffusion layer 106.

The coating 112 can be disposed on at least the first surface 108 or the second surface 110 of the diffusion layer 106. The coating 112 can be substantially transparent, translucent, or allow some portion of light to pass and can aid in the diffusion of light from the light source 116. In the embodiment shown, the coating 112 is disposed on the outer surface 108. The coating 112 may be urethane paint approximately 25 to approximately 30 microns in thickness. The coating 112 can be applied by spraying and then cured by infrared convection.

The diffusion layer 106 can be placed substantially between the coating 112 and the light source 116. The diffusion layer 106 may also be generally between the coating 112 and the one or more components 114 that at least partially block the light from the light source 116. The diffusion layer 106 is made from a material that allows at least some visible light to pass through the outer surface 108 and the inner surface 110. The diffusion layer 106 can be made from glass or a suitable plastic or polymer, such as, polyethylene, polyethylene terepthalate, polypropylene, polyvinyl chloride, polystyrene, polyamide, polypthalamide, or other similar material that allows at least some portion of light to pass through it. In other embodiments, the diffusion layer 106 can have a generally white color or some other coloring that changes the color of the light passing through the diffusion layer 106. Also, the diffusion layer 106 has a predetermined thickness that diffuses light that passes from the inner surface 110 to the outer surface 108. Although the diffusion layer 106 diffuses light, the light passes substantially through the outer surface 108 of the diffusion layer 106, the inner surface 110 of the diffusion layer 106, and the coating 112 to illuminate at least one of the controls, images, or indicia 104 on the coating 112. In one exemplary embodiment, the thickness of the diffusion layer 106 is approximately 2.5 mm to approximately 3.0 mm, and the diffusion layer 106 is made from translucent white polycarbonate plastic, such as lexan. In alternate embodiments, the diffusion layer 106 can be a substantially transparent, translucent, or diffusive film layer between one or more other layers. In yet other embodiments, the diffusion layer 106 can be a layer of substantially transparent, translucent, or diffusive paint.

Also, although the diffusion layer 106 is shown as being substantially planar, the invention is not limited to control console assemblies 100 with generally planar diffusion layers 106. In other embodiments, the diffusion layer 106 can include a curved portion, a cavity, an indent, a protruding portion, a raised portion, or some other feature that provides utility or adornment to the diffusion layer 106.

Also, the control console assembly 118 shown in the figures includes at least one capacitive sensor related to one of the controls, graphics, or indicia 104. The capacitive sensor or touch cell can include an electrode 120 that is electrically coupled to traces or other components 114 that work in conjunction with the electrode 120. The electrode 120 can provide an electric field that can be disrupted to actuate the capacitive sensor or touch cell. Thus, the electrode 120 is preferably disposed as close as possible to a surface of the automobile control console assembly 118 to eliminate any air gap near the electrode 120 that can degrade or disrupt the electric field. Accordingly, the elimination of any air gap is critical to the function and performance of the capacitive sensor or touch cell. Thus, in the embodiment shown, the electrode 120 is preferably disposed as close as possible to the coating 112 to eliminate any air gaps and so that the electric field of the electrode 120 can extend beyond the coating 112 so that it can be disrupted by the user to actuate the capacitive sensor or touch cell. The related traces or other components 114 of the capacitive sensor or touch cell do not have to be near the coating 112. Therefore, in the embodiment shown, at least a portion of the outer surface 108 of the diffusion layer 106 is placed immediately adjacent to coating 112, and a portion of the inner surface 110 of the diffusion layer 106 is placed immediately adjacent an electrode 120 of the capacitive sensor.

An adhesive layer 124 can couple the electrode 120 to the inner surface 110 of the diffusion layer 106. The adhesion layer 124 may be disposed on at least a portion of the inner surface 110 of the diffusion layer 106. The adhesion layer 124 may substantially eliminate any air gap between the electrode 120 and the inner surface 110 of the diffusion layer 106. In the embodiment shown, the adhesive layer 124 is approximately 8 microns to approximately 10 microns in thickness. The adhesive layer 124 can also couple a substrate 126 to the inner surface 110 of the diffusion layer 106. In alternate embodiments, a substantially transparent electrode 120 of a capacitive sensor can be disposed on the outer surface 108 of the diffusion layer 106. A substantially transparent electrode 120 can be made from indium tin oxide. The traces or components 114 related to the electrode 120 may then be disposed through or around the diffusion layer 106 to the substrate 126.

The substrate 126 provides a surface for mounting the trace or component 114 or the electrode 120. The substrate 126 is placed adjacent the inner surface 110 of the diffusion layer 106. The electrode 120 can be placed on an outer surface of the substrate 126, while its related traces and components 114 can be placed on an opposite inner surface of the substrate 126. Although the substrate 126 is shown as being substantially planar, in other embodiments, the substrate 126 can include a curved portion, a cavity, an indent, a protruding portion, a raised portion, or some other feature. In the embodiment shown, the substrate 126 is made from FR4, but in other embodiments, the substrate 126 can be made from any suitable material that provides a generally rigid surface for mounting a component 114.

The light source 116 positioned behind substrate 126 and provides light to illuminate at least a portion of the coating 112. The light source 116 can be an incandescent light, a fluorescent light, a light emitting diode, or any other light-emitting device. The light source 116 can be shaped so that substantially all the light is directed towards the coating 112. In the embodiment shown, the light source 116 is spaced apart from the substrate 126.

Figure 4:
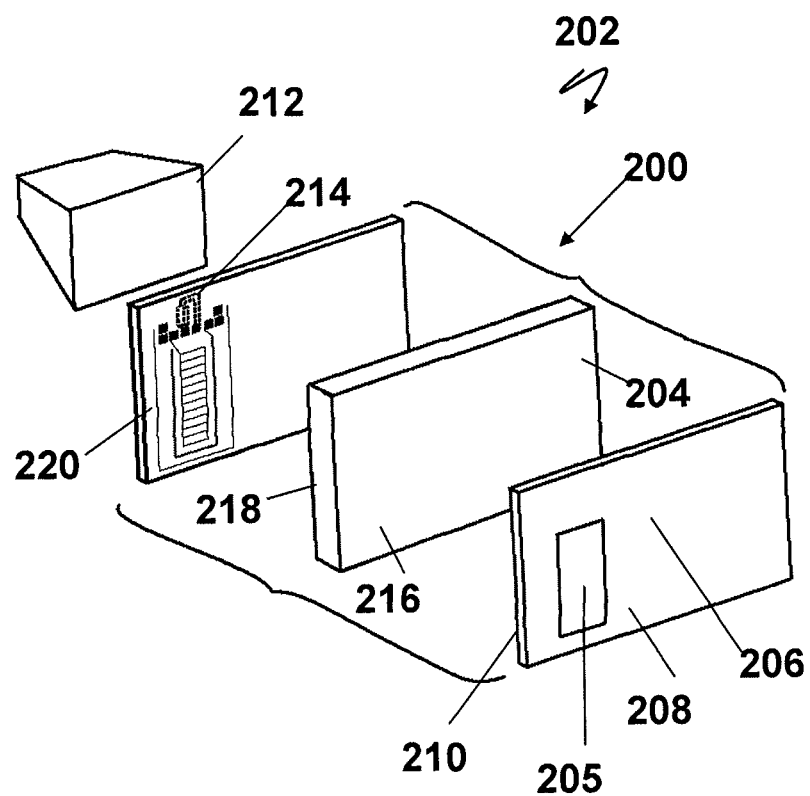
FIG. 4 is an exploded, perspective view of an assembly for illuminating a panel in accordance with another embodiment of the invention
Figure 5:
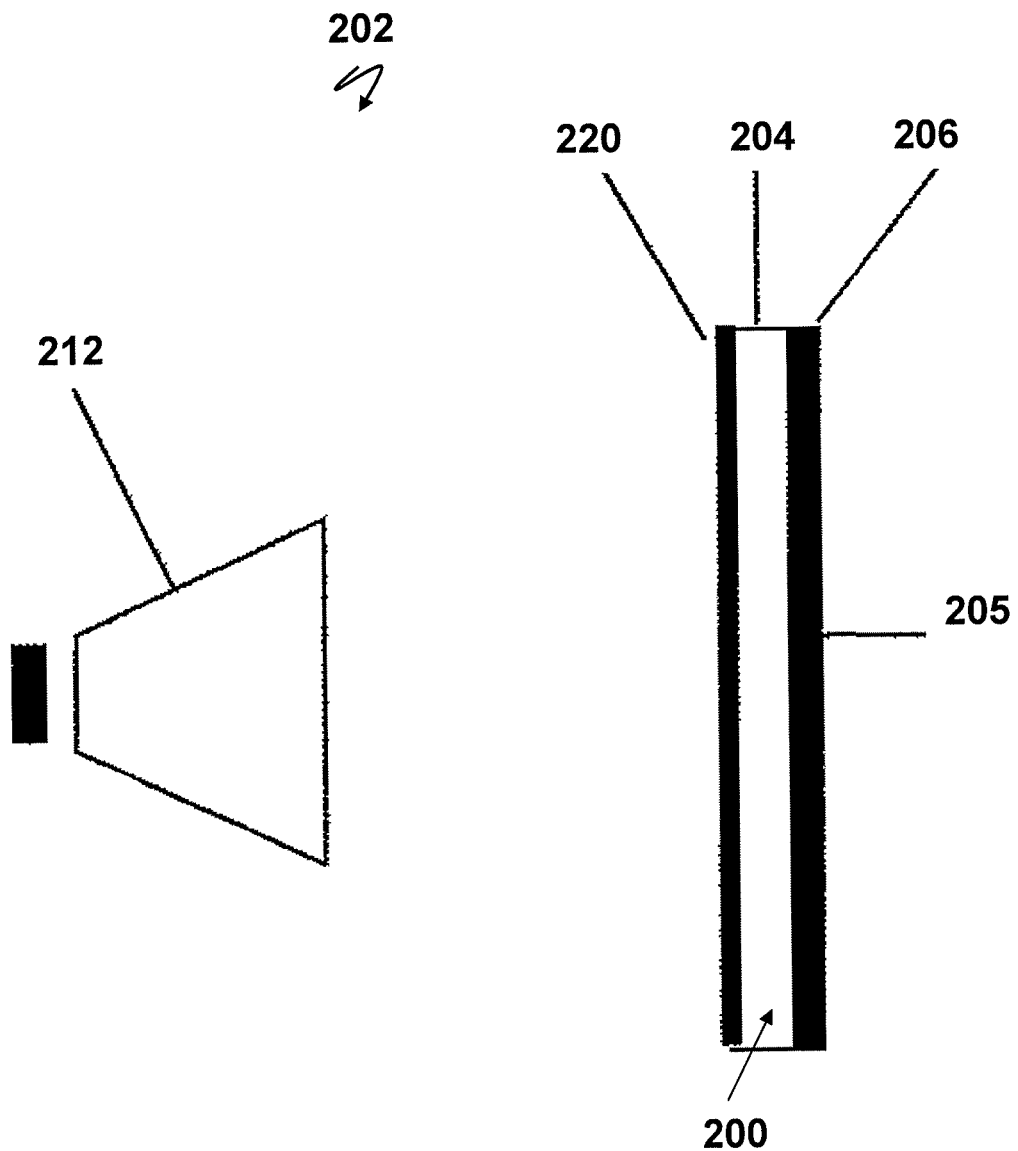
FIG. 5 is a side elevational view of the assembly illustrated in FIG. 4.

Turning to FIGS. 4 and 5, an assembly 200 is shown in an exploded perspective view in a control console assembly 202. The control console assembly 202 provides an interface between a user and one or more mechanical, electrical, or electromechanical systems. In the embodiment shown, the control console assembly 202 provides an interface between one or more systems of an automobile and its operator. Although an assembly 200 for use in the control console assembly 202 of an automotive vehicle is shown, the invention is not limited to automotive applications. In other embodiments, the assembly 200 can be used in household appliances, exercise equipment, audio equipment, home entertainment components, and other applications where an interface for a user may be desired. Unlike the diffusion layer 106, the diffusion layer 204 has no coating 112. Instead, the assembly 200 includes a panel 206 that is used in place of the coating 112.

The panel 206 can have a first surface 208 and a second surface 210 substantially opposite the first surface 208. The first surface 208 can be an outer surface 208, and the second surface 210 can be an inner surface 210 substantially opposite the outer surface 208, separated by the thickness of the panel 206. The controls, graphic images, or some other indicia 205 are disposed on either of the inner surface 210 or the outer surface 208 of the panel 206. The panel 206 can be substantially translucent, transparent, or allow some portion of the light from a light source 212 to pass through the panel 206. The panel 206 can be made from glass, a suitable plastic or polymer, such as, polyethylene, polyethylene terepthalate, polypropylene, polyvinyl chloride, polystyrene, polyamide, polypthalamide, or other similar material that can provide a surface 208 or 210 for one or more controls, indicia, or graphic images 205.

The controls, indicia, or graphic images 205 are substantially similar to the controls, indicia, or graphic images 104, and thus a detailed description thereof is omitted. Furthermore, in the embodiment shown, one or more of the controls 205 operates in conjunction with a capacitive sensor or a touch cell. In other embodiments, one or more of the controls 205 can operate with a device that is mechanical, electrical, optical, some combination of the aforementioned, or some other device that allows a user to interface with another device or system.

The diffusion layer 204 can be disposed substantially between the panel 206 and a light source 212. The diffusion layer 204 may also be disposed generally between the panel 206 and any trace or component 214. The diffusion layer 212 has an outer surface 216 and an inner surface 218 substantially opposite the outer surface 216 separated by the thickness of the diffusion layer 204. The diffusion layer 204 can have a predetermined thickness that diffuses light that passes from the inner surface 218 to the outer surface 216. In the exemplary embodiment shown, the thickness of the diffusion layer 204 is approximately 2.5 mm and has a light transmittance of approximately 35%. The diffusion layer 204 is substantially similar to the diffusion layer 106, and thus a detailed description thereof is omitted.

The diffusion layer 204 is made from a material that allows at least some visible light to pass through the outer surface 216 and the inner surface 218. The diffusion layer 204 can be made from translucent white polycarbonate plastic. Also, because the control console assembly 202 shown includes at least one capacitive sensor related to one of the controls, graphics, or indicia 205, at least a portion of the outer surface 216 of the diffusion layer 204 is placed immediately adjacent to the inner surface 210 of the panel 206, and a portion of the inner surface 218 of the diffusion layer 204 is disposed immediately adjacent a substrate 220 for the traces and components 214 of the capacitive sensor so that any air gap between the inner surface 210 of the panel 206 and the substrate 220 is substantially eliminated. The elimination of the air gap is critical to the function and performance of a capacitive sensor or touch cell. In alternate embodiments, the diffusion layer 204 can be a substantially transparent, translucent, or diffusive film layer between one or more other layers. In yet other embodiments, the diffusion layer 204 can be a layer of substantially transparent, translucent, or diffusive paint on a side of the panel 206.

The substrate 220 provides a surface for mounting the trace or component 214. The substrate 220 is substantially similar to substrate 126, and thus a detailed description is omitted. The light source 212 can be positioned behind substrate 220 to provide light to illuminate at least a portion of the panel 206. The light source 212 is substantially similar to light source 116, and a detailed description thereof is omitted.

Figure 6:
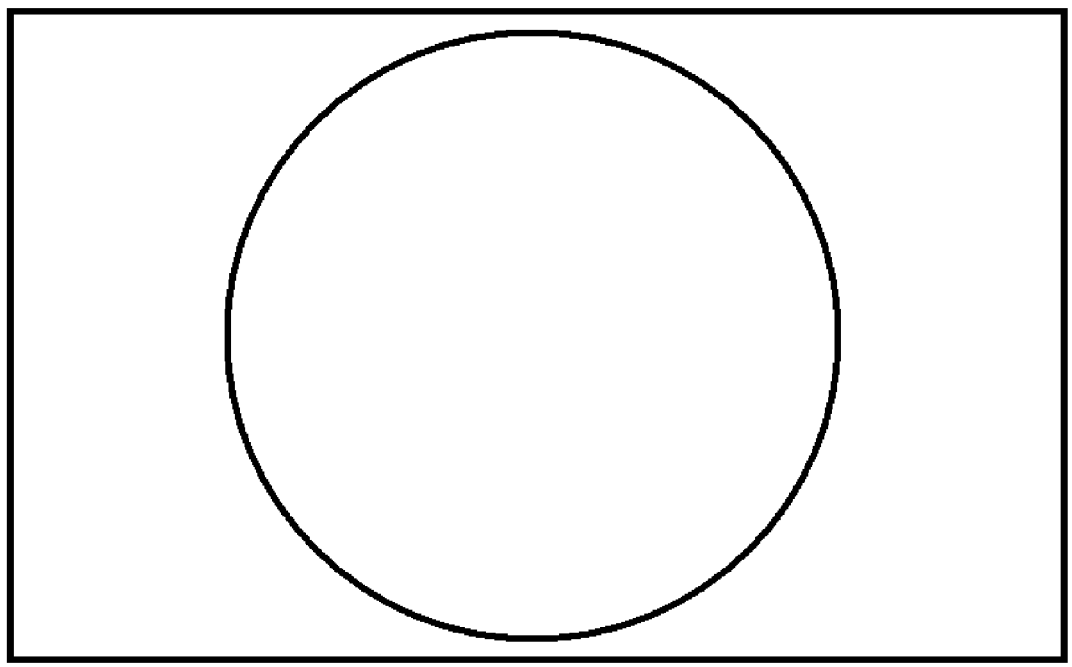
FIG. 6 is a front elevational view of a panel illuminated by an assembly for illuminating a panel.

As apparent form the foregoing description, the assembly 100 or 200 can provide illumination for controls, indicia, or graphic images 104 or 205 with substantially no shadowing or negative imaging, as shown in FIG. 6. Comparing FIG. 1 and FIG. 6, with an assembly 100 or 200, the traces or components 114 or 214 or electrodes 120 do not substantially produce a shadow or negative image on the controls, indicia, or graphic images 104 or 205.

While particular embodiments have been chosen to illustrate the invention, it will be understood by those skilled in the art that various changes and modifications can be made therein without departing from the scope of the invention as defined in the appended claims.

What is claimed is:

1. A control console assembly comprising:
   a diffusion layer including an outer surface and an inner surface substantially opposite the outer surface;
   a coating disposed immediately adjacent to the outer surface of the diffusion layer, the coating including one or more controls disposed thereon; and
   at least one capacitive sensor having an electrode, the electrode coupled to the inner surface of the diffusion layer such that there is no air gap between the electrode and the diffusion layer,
   wherein each capacitive sensor is configured to operate in conjunction with one of the at least one controls.

2. A control console assembly according to claim 1, wherein the coating is made from urethane paint.

3. A control console assembly according to claim 1, wherein the diffusion layer is made of polycarbonate plastic.

4. A control console assembly according to claim 1, wherein the diffusion layer is made of a translucent material.

5. A control console assembly according to claim 1, wherein the diffusion layer is white.

6. A control console assembly according to claim 1, further comprising an adhesive layer disposed on the inner surface of the diffusion layer.

7. A control console assembly according to claim 6, further comprising a substrate coupled to the diffusion layer by the adhesive layer.

8. A control console assembly comprising:
   a diffusion layer including an outer surface and an inner surface substantially opposite the outer surface;
   a panel through which a portion of light passes, the panel disposed immediately adjacent to the outer surface of the diffusion layer, and including one or more controls disposed thereon; and
   at least one capacitive sensor having an electrode, the electrode coupled to the inner surface of the diffusion layer such that there is no air gap between the electrode and the diffusion layer,
   wherein each capacitive sensor is configured to operate in conjunction with one of the at least one controls.

9. A control console assembly according to claim 8, wherein the diffusion layer is made of polycarbonate plastic.

10. A control console assembly according to claim 8, wherein the diffusion layer is made of a translucent material.

11. A control console assembly according to claim 8, wherein the diffusion layer is white.

12. A control console assembly according to claim 8, further comprising:
   an adhesive layer disposed on the inner surface of the diffusion layer, the adhesive layer coupling each electrode to the inner surface of the diffusion layer.

13. A control console assembly according to claim 12, further comprising a substrate coupled to the diffusion layer by the adhesive layer.

14. A control console assembly according to claim 1, further comprising a substrate disposed adjacent the inner surface of the diffusion layer, a portion of the substrate being immediately adjacent the inner surface of the diffusion layer, wherein each electrode is disposed on the substrate.

15. A control console assembly according to claim 1, wherein the coating includes one or more graphic images or indicia disposed thereon.

16. A control console assembly according to claim 8, wherein the panel includes one or more graphic images or indicia disposed thereon.

17. A control console assembly according to claim 1, wherein the coating has a thickness of approximately 25 to approximately 35 microns.

18. A control console assembly according to claim 1, wherein the coating is produced by a process comprising the steps of:
   applying a material on the outer surface of the diffusion layer; and
   curing the material.

19. A control console assembly according to claim 18, wherein the step of applying the material on the outer surface of the diffusion layer comprises spraying the material on the outer surface of the diffusion layer.

20. A control console assembly according to claim 18, wherein the step of curing the material comprises curing the material by infrared convection.

21. A control console assembly according to claim 1 further comprising a light source, wherein the light source is disposed such that the outer surface of the diffusion layer is directed away from the light source.

22. A control console assembly according to claim 8 further comprising a light source, wherein the light source is disposed such that the outer surface of the diffusion layer is directed away from the light source.

* * * * *